(12) United States Patent
Oh et al.

(10) Patent No.: US 12,167,593 B2
(45) Date of Patent: Dec. 10, 2024

(54) SEMICONDUCTOR DEVICE AND METHOD OF MANUFACTURING SEMICONDUCTOR DEVICE

(71) Applicant: SK hynix Inc., Icheon-si (KR)

(72) Inventors: Jae Young Oh, Icheon-si (KR); Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 674 days.

(21) Appl. No.: 17/357,648

(22) Filed: Jun. 24, 2021

(65) Prior Publication Data

US 2022/0189978 A1 Jun. 16, 2022

(30) Foreign Application Priority Data

Dec. 16, 2020 (KR) ........................ 10-2020-0176716

(51) Int. Cl.
*H10B 41/41* (2023.01)
*H10B 41/10* (2023.01)
*H10B 41/27* (2023.01)
*H10B 43/10* (2023.01)
*H10B 43/27* (2023.01)
*H10B 43/40* (2023.01)

(52) U.S. Cl.
CPC ............. *H10B 41/41* (2023.02); *H10B 41/10* (2023.02); *H10B 41/27* (2023.02); *H10B 43/10* (2023.02); *H10B 43/27* (2023.02); *H10B 43/40* (2023.02)

(58) Field of Classification Search
CPC ........ H10B 41/41; H10B 41/10; H10B 41/27; H10B 41/50; H10B 41/35; H10B 43/10; H10B 43/27; H10B 43/40; H10B 43/35; H10B 43/50; H01L 21/76829; H01L 21/76835; H01L 21/76897; H01L 23/5386; H01L 23/528; H01L 24/06; H01L 24/09; H01L 25/0657; H01L 2224/0812–08268; H01L 2224/80001–80986
See application file for complete search history.

(56) References Cited

U.S. PATENT DOCUMENTS 10,381,374 B2 8/2019 Tagami et al.
2006/0133144 A1* 6/2006 Lee ........................ G11C 16/10
365/185.12

(Continued)

FOREIGN PATENT DOCUMENTS

KR 100789612 B1 12/2007

*Primary Examiner* — Evren Seven
*Assistant Examiner* — Sarah L Ell
(74) *Attorney, Agent, or Firm* — William Park & Associates Ltd.

(57) ABSTRACT

There are provided a semiconductor memory device and a method of manufacturing a semiconductor memory device. The semiconductor memory device includes a conductive pattern, an etch stop layer on the conductive pattern, a conductive bonding pattern including a contact portion connected to the conductive pattern, and a pad portion extending from the contact portion, a first dielectric layer disposed on the etch stop layer and spaced apart from the conductive bonding pattern, and a second dielectric layer including a first portion surrounding a sidewall of the contact portion of the conductive bonding pattern between the pad portion of the conductive bonding pattern and the etch stop layer, and a second portion extending from the first portion to cover an upper surface of the first dielectric layer.

11 Claims, 8 Drawing Sheets

(56) References Cited

U.S. PATENT DOCUMENTS

| | | | | |
|---|---|---|---|---|
| 2017/0229341 | A1* | 8/2017 | Chang | H01L 23/528 |
| 2021/0057427 | A1* | 2/2021 | Oh | H01L 24/83 |
| 2021/0202382 | A1* | 7/2021 | Okina | H01L 23/5226 |
| 2021/0217716 | A1* | 7/2021 | Wu | H10B 41/40 |
| 2021/0375791 | A1* | 12/2021 | Oda | H01L 23/564 |

* cited by examiner

SEMICONDUCTOR DEVICE AND METHOD OF MANUFACTURING SEMICONDUCTOR DEVICE

CROSS-REFERENCE TO RELATED APPLICATION

The present application claims priority under 35 U.S.C. § 119(a) to Korean patent application number 10-2020-0176716 filed on Dec. 16, 2020, in the Korean Intellectual Property Office, the entire disclosure of which is incorporated by reference herein.

BACKGROUND

1. Technical Field

The present disclosure may relate to a semiconductor device and a method of manufacturing the semiconductor device, and more particularly, to a semiconductor device including a bonding pattern and a method of manufacturing the semiconductor device.

2. Related Art

A semiconductor device may include circuit structures connected to each other by conductive bonding patterns. Each of the circuit structures may include a plurality of conductive patterns.

In order to increase a degree of integration of the semiconductor device, a critical dimension (CD) of the conductive pattern may be decreased. As the CD of the conductive pattern decreases, it becomes difficult to align the conductive bonding pattern with the conductive pattern. Accordingly, a process defect may increase and reliability of the semiconductor device may decrease.

SUMMARY

According to an embodiment of the present disclosure, a semiconductor device may include a conductive pattern, an etch stop layer on the conductive pattern, a conductive bonding pattern including a contact portion passing through the etch stop layer and connected to the conductive pattern, and a pad portion extending from the contact portion and having a width wider than a width of the contact portion, a first dielectric layer disposed on the etch stop layer and spaced apart from the conductive bonding pattern, and a second dielectric layer including a first portion surrounding a sidewall of the contact portion of the conductive bonding pattern between the pad portion of the conductive bonding pattern and the etch stop layer, and a second portion extending from the first portion to cover an upper surface of the first dielectric layer.

According to an embodiment of the present disclosure, a semiconductor device may include a first conductive bonding pattern and a second conductive bonding pattern bonded to each other and extending toward opposite directions, a first etch stop layer penetrated by an end of the first conductive bonding pattern, a second etch stop layer penetrated by an end of the second conductive bonding pattern, a first dielectric layer disposed between the first etch stop layer and the second etch stop layer and having a first sidewall facing the first conductive bonding pattern, a second dielectric layer disposed between the first conductive bonding pattern and the first sidewall of the first dielectric layer and extending between the first dielectric layer and the second etch stop layer, a third dielectric layer disposed between the second dielectric layer and the second etch stop layer and having a second sidewall facing the second conductive bonding pattern, and a fourth dielectric layer disposed between the second conductive bonding pattern and the second sidewall of the third dielectric layer, extending between the third dielectric layer and the second dielectric layer, and bonded to the second dielectric layer.

According to an embodiment of the present disclosure, a method of manufacturing a semiconductor device may include forming a conductive pattern, forming an etch stop layer on the conductive pattern, forming a first dielectric layer on the etch stop layer, forming an opening passing through a portion of the first dielectric layer overlapping the conductive pattern, and exposing a portion of the etch stop layer, forming a second dielectric layer extending along a surface of the opening and an upper surface of the first dielectric layer, and having a groove overlapping the opening and the conductive pattern, forming a contact hole exposing the conductive pattern, by etching a portion of each of the second dielectric layer and the etch stop layer, and filling the opening and the contact hole with a conductive bonding pattern.

DETAILED DESCRIPTION

Specific structural or functional descriptions disclosed herein are merely illustrative for the purpose of describing embodiments according to the concept of the present disclosure. The embodiments according to the concept of the present disclosure can be implemented in various forms, and should not be construed as being limited to the specific embodiments set forth herein.

In an embodiment of the present disclosure, terms such as first and second may be used to distinguish one component from another component. The components are not limited by the terms.

An embodiment of the present disclosure provides a semiconductor device capable of improving reliability of the semiconductor device and a method of manufacturing the semiconductor device.

Figure 1:
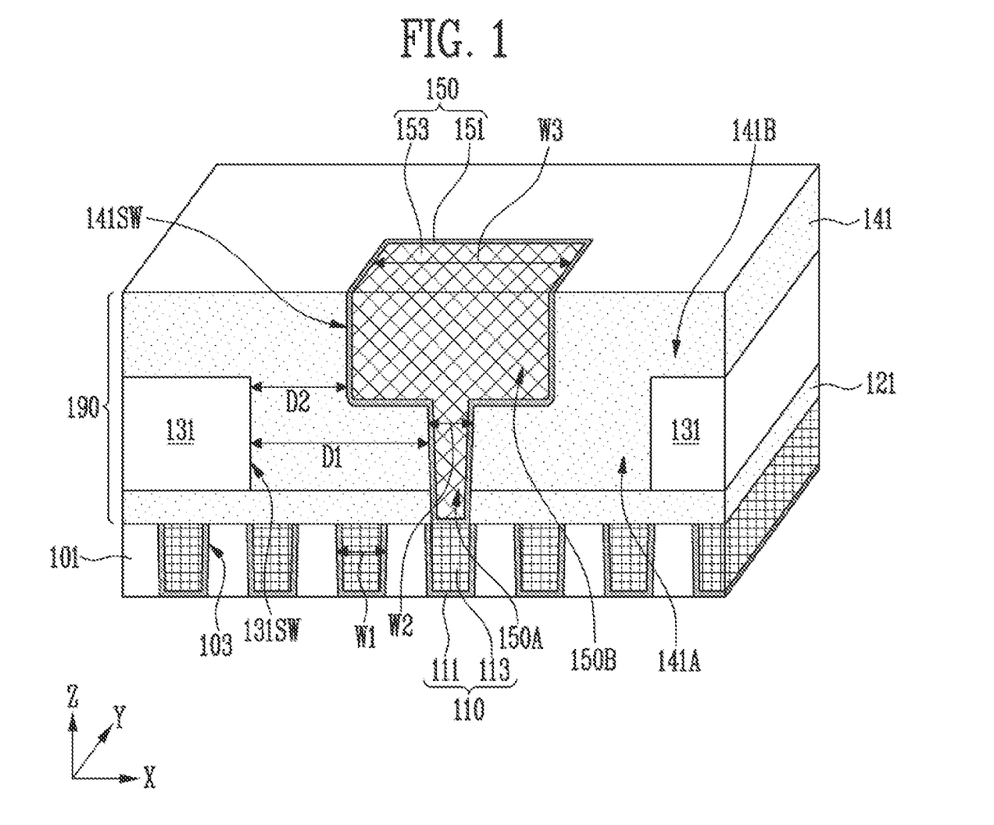
FIG. 1 is a perspective view schematically illustrating a portion of a semiconductor device according to an embodiment of the present disclosure.

FIG. 1 is a perspective view schematically illustrating a portion of a semiconductor device according to an embodiment of the present disclosure.

Referring to FIG. 1, the semiconductor device may include a plurality of first conductive patterns 110, a first insulating structure 190 on the plurality of first conductive patterns 110, and a first conductive bonding pattern 150 buried in the first insulating structure 190.

The first conductive patterns 110 may extend parallel to each other and may be insulated from each other by an insulating layer 101. In an embodiment, the first conductive patterns 110 may be spaced apart from each other in an X-axis direction X and may extend in a Y-axis direction Y.

The insulating layer 101 may be penetrated by trenches 103, and the first conductive patterns 110 may be disposed inside the trenches 103, respectively. In an embodiment, each of the first conductive patterns 110 may include a conductive barrier layer 111 and a metal layer 113. The conductive barrier layer 111 may be disposed between the insulating layer 101 and the metal layer 113 and may extend along a bottom surface of the metal layer 113. However, the present disclosure is not limited thereto, and each of the first conductive patterns 110 may include various conductive materials such as metal silicide.

The first insulating structure 190 may include a first etch stop layer 121, a first dielectric layer 131 on the first etch stop layer 121, and a second dielectric layer 141 on the first etch stop layer 121.

The first etch stop layer 121 may extend parallel to an X-Y plane to cover the first conductive patterns 110 and the insulating layer 101. The first etch stop layer 121 may serve as a capping layer protecting the first conductive patterns 110. In an embodiment, the first etch stop layer 121 may include silicon carbon nitride (SiCN) including carbon.

The first dielectric layer 131 may contact an upper surface of the first etch stop layer 121. The first dielectric layer 131 may be formed of a material different from that of the first etch stop layer 121. For example, the first dielectric layer 131 may include an insulating material having an etching selectivity for the first etch stop layer 121. In an embodiment, the first dielectric layer 131 may include silicon dioxide ($SiO_2$).

The first dielectric layer 131 may be spaced apart from the first conductive bonding pattern 150. The second dielectric layer 141 may be disposed in a space between the first dielectric layer 131 and the first conductive bonding pattern 150. The second dielectric layer 141 may extend to cover an upper surface of the first dielectric layer 131. The second dielectric layer 141 may be formed of a material different from that of the first dielectric layer 131.

The second dielectric layer 141 may include elements of the same type as the first etch stop layer 121. In an embodiment, the second dielectric layer 141 may have the same chemical composition as the first etch stop layer 121.

The second dielectric layer 141 may include an insulating material having a dielectric constant lower than that of the first dielectric layer 131. The second dielectric layer 141 may have the dielectric constant lower than that of the first dielectric layer 131 by including carbon. The second dielectric layer 141 may include an insulating material preventing or mitigating diffusion of metal.

In an embodiment, the second dielectric layer 141 may include silicon carbon nitride (SiCN).

The first conductive bonding pattern 150 may be connected to a corresponding first conductive pattern among the first conductive patterns 110. The first conductive bonding pattern 150 may include a contact portion 150A and a pad portion 150B. The contact portion 150A may be connected to the first conductive pattern 110 and may extend in a Z-axis direction Z to pass through the first etch stop layer 121. The pad portion 150B may extend from the contact portion 150A, and may extend parallel to the X-Y plane on the contact portion 150A.

A width W3 of the pad portion 150B may be wider than a width W2 of the contact portion 150A and a width W1 of the first conductive pattern 110. Accordingly, the first conductive bonding pattern 150 may have a T-shaped cross section.

The first conductive bonding pattern 150 may include a conductive barrier layer 151 and a metal layer 153. The conductive barrier layer 151 may contact the first conductive pattern 110, the first etch stop layer 121 and the second dielectric layer 141. The metal layer 153 may be disposed on the conductive barrier layer 151. The metal layer 153 may include copper.

The first dielectric layer 131 may include a first sidewall 131SW facing the first conductive bonding pattern 150. A distance D1 between the contact portion 150A of the first conductive bonding pattern 150 and the first sidewall 131SW of the first dielectric layer 131 may be defined to be greater than a distance D2 between the pad portion 150B of the first conductive bonding pattern 150 and the first sidewalls 131SW of the first dielectric layer 131.

The second dielectric layer 141 may include a first portion 141A and a second portion 141B. The first portion 141A may be disposed between the pad portion 150B of the first conductive bonding pattern 150 and the first etch stop layer 121. The first portion 141A may surround a sidewall of the contact portion 150A of the first conductive bonding pattern 150. The second portion 141B may extend from the first portion 141A to cover an upper surface of the first dielectric layer 131. The second portion 141B may include a sidewall 141SW coplanar with a sidewall of the pad portion 150B of the first conductive bonding pattern 150.

The pad portion 150B of the first conductive bonding pattern 150 and the second dielectric layer 141 of the first insulating structure 190 may be provided for hybrid bonding.

Figure 2:
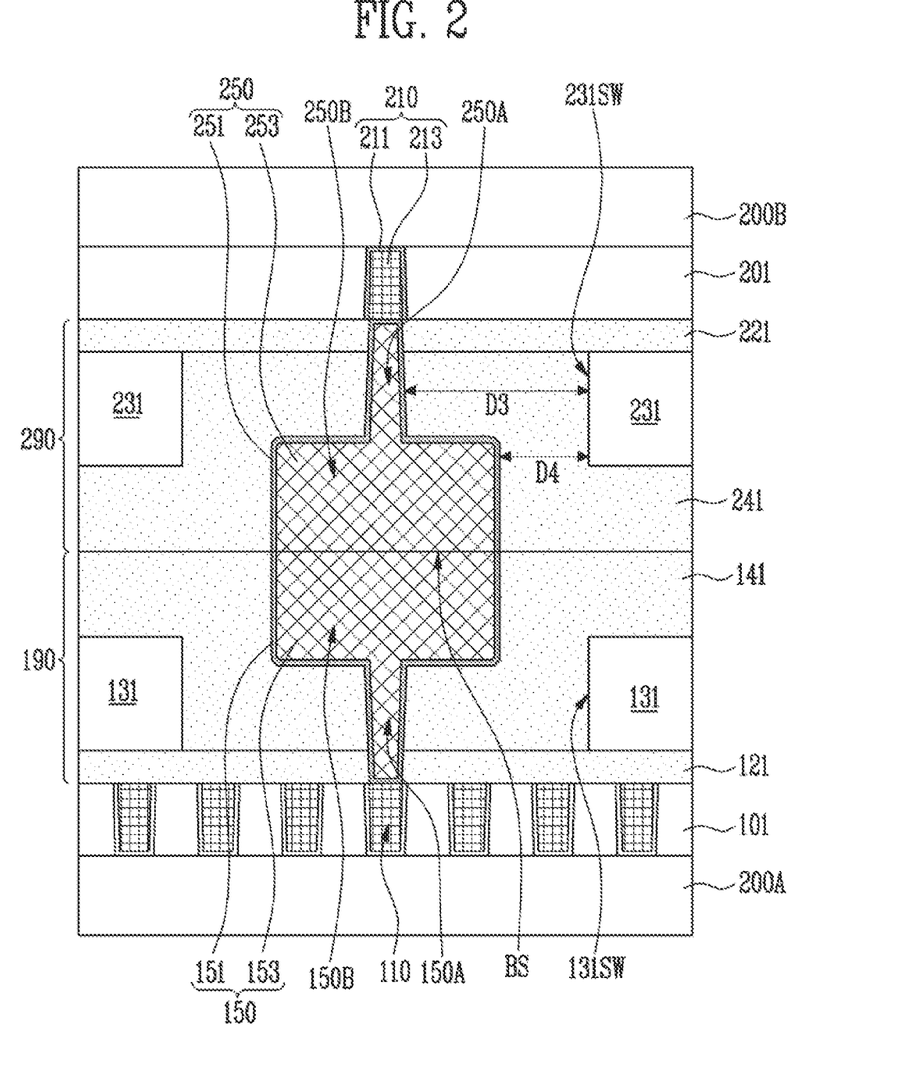
FIG. 2 is a cross-sectional view illustrating a semiconductor device according to an embodiment of the present disclosure.

FIG. 2 is a cross-sectional view illustrating a semiconductor device according to an embodiment of the present disclosure.

Referring to FIG. 2, the semiconductor device may include not only the insulating layer 101, the first conductive patterns 110, the first insulating structure 190, and the first conductive bonding pattern 150 described with reference to FIG. 1 but also a second conductive bonding pattern 250, a second insulating structure 290, a second conductive pattern 210, a first circuit structure 200A, and a second circuit structure 200B. Hereinafter, a repetitive description of the same components as those shown in FIG. 1 is omitted.

The second conductive bonding pattern 250 may be bonded to the first conductive bonding pattern 150. The first conductive bonding pattern 150 and the second conductive bonding pattern 250 may extend in directions opposite to each other.

Each of the first conductive bonding pattern 150 and the second conductive bonding pattern 250 may include a pad portion 150B or 250B adjacent to a bonding surface BS between the first conductive bonding pattern 150 and the second conductive bonding pattern 250, and a contact portion 150A or 250A extending in a direction away from the bonding surface BS from the pad portion 150B or 250B. A width of the pad portion 250B of the second conductive bonding pattern 250 may be wider than a width of the contact portion 250A of the second conductive bonding pattern 250.

The second conductive bonding pattern 250 may include a conductive barrier layer 251 and a metal layer 253. The metal layer 253 of the second conductive bonding pattern 250 may be bonded to the metal layer 153 of the first conductive bonding pattern 150. The metal layer 253 of the second conductive bonding pattern 250 may be formed of the same material as the metal layer 153 of the first conductive bonding pattern 150. In an embodiment, the metal layer 253 of the second conductive bonding pattern 250 may include copper. The conductive barrier layer 251 of the second conductive bonding pattern 250 may be disposed between the metal layer 253 of the second conductive bonding pattern 250 and the second insulating structure 290, and may extend between the metal layer 253 of the second conductive bonding pattern 250 and the second conductive pattern 210. The conductive barrier layer 251 of the second conductive bonding pattern 250 may be formed of the same material as the conductive barrier layer 151 of the first conductive bonding pattern 150. The conductive barrier layer 151 of the first conductive bonding pattern 150 and the conductive barrier layer 251 of the second conductive bonding pattern 250 may include tantalum (Ta), tantalum nitride (TaN), titanium (Ti), titanium nitride (TiN), tungsten (W), tungsten nitride (WN), and the like.

The second insulating structure 290 may include a second etch stop layer 221, a third dielectric layer 231, and a fourth dielectric layer 241.

The second etch stop layer 221 of the second insulating structure 290 may overlap the first etch stop layer 121 of the first insulating structure 190.

The first conductive bonding pattern 150 and the second conductive bonding pattern 250 may be disposed between the first etch stop layer 121 and the second etch stop layer 221. The first etch stop layer 121 may be penetrated by the end of the first conductive bonding pattern 150, and the second etch stop layer 221 may be penetrated by an end of the second conductive bonding pattern 250. The end of the first conductive bonding pattern 150 may be connected to one of the first conductive patterns 110, and the end of the second conductive bonding pattern 250 may be connected to the second conductive pattern 210.

The second etch stop layer 221 may include carbon. In an embodiment, the second etch stop layer 221 may include silicon carbon nitride (SiCN).

The first dielectric layer 131 of the first insulating structure 190 may be disposed between the first etch stop layer 121 and the second etch stop layer 221. The second dielectric layer 141 of the first insulating structure 190 may fill between the first sidewall 131SW of the first dielectric layer 131 and the first conductive bonding pattern 150, and may extend between the first dielectric layer 131 of the first insulating structure 190 and the second etch stop layer 221 of the second insulating structure 290.

The third dielectric layer 231 and the fourth dielectric layer 241 of the second insulating structure 290 may be disposed between the first insulating structure 190 and the second etch stop layer 221.

The third dielectric layer 231 may be disposed between the second dielectric layer 141 of the first insulating structure 190 and the second etch stop layer 221 of the second insulating structure 290. The third dielectric layer 231 may contact the second etch stop layer 221. The third dielectric layer 231 may be formed of a material different from that of the second etch stop layer 221. For example, the third dielectric layer 231 may include an insulating material having an etching selectivity for the second etch stop layer 221. In an embodiment, the third dielectric layer 231 may include silicon dioxide ($SiO_2$).

The third dielectric layer 231 may be spaced apart from the second conductive bonding pattern 250. The third dielectric layer 231 may include a second sidewall 231SW facing the second conductive bonding pattern 250. A distance D3 between the contact portion 250A of the second conductive bonding pattern 250 and the second sidewall 231SW of the third dielectric layer 231 may be defined to be greater than a distance D4 between the pad portion 250B of the second conductive bonding pattern 250 and the second sidewalls 231SW of the third dielectric layer 231.

The fourth dielectric layer 241 may fill a space between the second sidewall 231SW of the third dielectric layer 231 and the second conductive bonding pattern 250. The fourth dielectric layer 241 may extend between the third dielectric layer 231 of the second insulating structure 290 and the second dielectric layer 141 of the first insulating structure 190. The fourth dielectric layer 241 may contact the third dielectric layer 231 of the second insulating structure 290 and bonded to the second dielectric layer 141 of the first insulating structure 190.

The fourth dielectric layer 241 may include elements of the same type as the second etch stop layer 221. In an embodiment, the fourth dielectric layer 241 may be formed of the same chemical material as the second etch stop layer 221.

The fourth dielectric layer 241 may be formed of a material different from that of the third dielectric layer 231. The fourth dielectric layer 241 may include an insulating material preventing or mitigating diffusion of metal.

In an embodiment, the fourth dielectric layer 241 may include silicon carbon nitride (SiCN).

According to the structure described above, the fourth dielectric layer 241 may contact the sidewall of the contact portion 250A of the second conductive bonding pattern 250, a surface of the pad portion 250B of the second conductive bonding pattern 250 facing the second etch stop layer 221, the sidewall of the pad portion 250B of the second conductive bonding pattern 250, the second sidewall 231SW of the third dielectric layer 231, and a surface of the third dielectric layer 231 facing the second dielectric layer 141. Similarly to the fourth dielectric layer 241, the second dielectric layer 141 may contact the sidewall of the contact portion 150A of the first conductive bonding pattern 150, a surface of the pad portion 150B of the first conductive bonding pattern 150, one surface of the pad portion 150B of the first conductive bonding pattern 150 facing the first etch stop layer 121, the sidewall of the pad portion 150B of the first conductive bonding pattern 150, the first sidewall 131SW of the first dielectric layer 131, and a surface of the first dielectric layer 131 facing the fourth dielectric layer 241.

Bonding between the pad portion 150B of the first conductive bonding pattern 150 and the pad portion 250B of the second conductive bonding pattern 250, and bonding between the second dielectric layer 141 of the first insulating structure 190 and the fourth dielectric layers 241 of the second insulating structure 290 may provide hybrid bonding. By the hybrid bonding, the first circuit structure 200A and the second circuit structure 200B may be structurally and electrically connected to each other.

The first circuit structure 200A may be connected to the first conductive patterns 110. The first conductive patterns 110 and the insulating layer 101 may be disposed between the first circuit structure 200A and the first conductive bonding pattern 150. The first conductive pattern 110 may electrically connect the first circuit structure 200A to the first conductive bonding pattern 150.

The second circuit structure 200B may be connected to the second conductive pattern 210. The second conductive pattern 210 may pass through an insulating layer 201 disposed between the second circuit structure 200B and the second conductive bonding pattern 250. The second conductive pattern 210 may electrically connect the second circuit structure 200B to the second conductive bonding pattern 250. The second conductive pattern 210 may include a metal layer 213 and a conductive barrier layer 211. The conductive barrier layer 211 may be disposed between the insulating layer 201 and the metal layer 213, and may extend between the second circuit structure 200B and the metal layer 213.

According to the above-described structure, the first conductive patterns 110, the first conductive bonding pattern 150, the first insulating structure 190, the second insulating structure 290, the second conductive bonding pattern 250, and the second conductive pattern 210 may be disposed between the first circuit structure 200A and the second circuit structure 200B.

The first circuit structure 200A and the second circuit structure 200B may be variously designed. In FIG. 2, the first circuit structure 200A and the second circuit structure 200B are shown as blocks, but each of the first circuit structure 200A and the second circuit structure 200B may include a memory cell array structure or may include a circuit structure. An embodiment of the first circuit structure 200A and the second circuit structure 200B is shown in FIG. 3.

Figure 3:
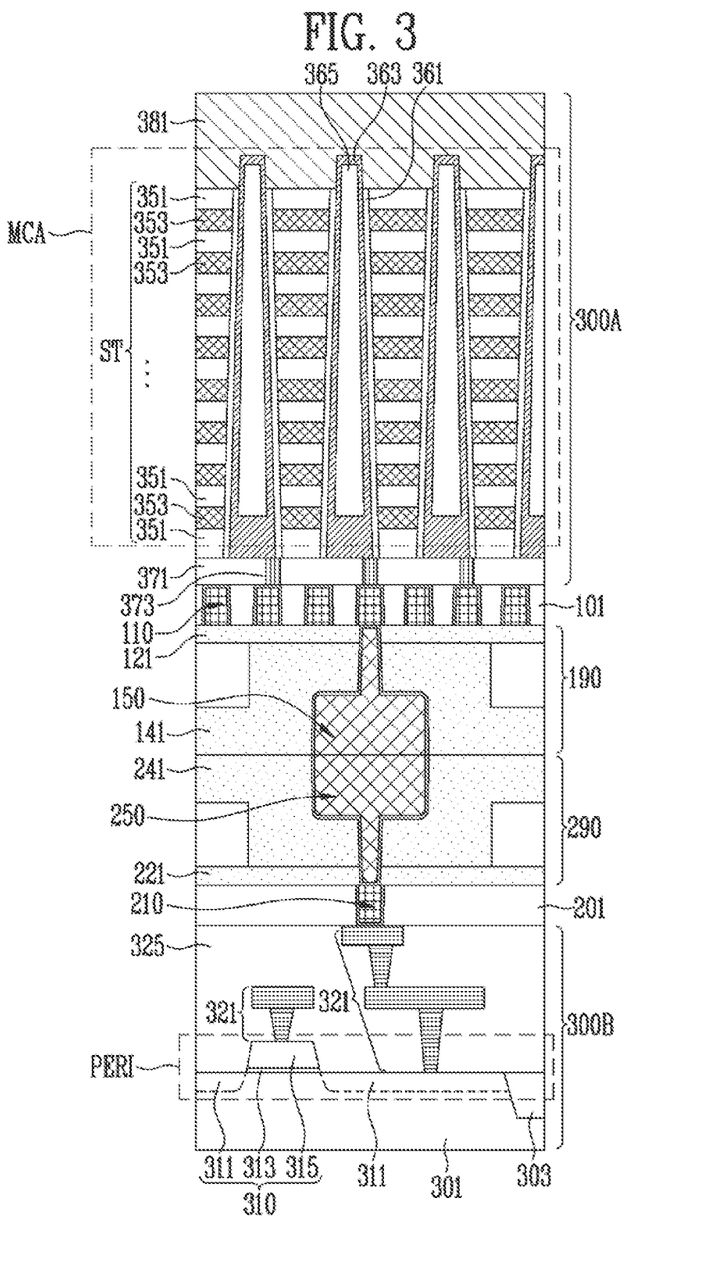
FIG. 3 is a cross-sectional view illustrating a semiconductor device according to an embodiment of the present disclosure.

FIG. 3 is a cross-sectional view illustrating a semiconductor device according to an embodiment of the present disclosure.

Referring to FIG. 3, the semiconductor device may include not only the insulating layer 101, the first conductive patterns 110, the first insulating structure 190, and the first conductive bonding pattern 150 described with reference to FIGS. 1 and 2 but also the second conductive bonding pattern 250, the second insulating structure 290, the insulating layer 201, and the second conductive pattern 210 described with reference to FIG. 2. In addition, the semiconductor device may further include a first circuit structure 300A and a second circuit structure 300B. Hereinafter, a repetitive description of the same components as those shown in FIGS. 1 and 2 is omitted.

The insulating layer 101, the first conductive patterns 110, the first insulating structure 190, the first conductive bonding pattern 150, the second conductive bonding pattern 250, the second insulating structure 290, the insulating layer 201, and the second conductive pattern 210 are shown in FIG. 3 in a vertically inverted shape from an example shown in FIG. 2.

The first circuit structure 300A may include a source layer 381 overlapping the first conductive patterns 110, and a memory cell array structure MCA disposed between the source layer 381 and the first conductive patterns 110.

The memory cell array structure MCA may include a gate stack ST disposed between the source layer 381 and the first conductive patterns 110, a channel structure 363 passing through the gate stack ST, and a memory layer 361 surrounding a sidewall of the channel structure 363.

The gate stack ST may include interlayer insulating layers 351 and gate electrodes 353 alternately disposed between the source layer 381 and the first conductive patterns 110. In an embodiment, the gate electrodes 353 may be used as select lines and word lines of a NAND flash memory element. For example, one or more layers of gate electrodes 353 adjacent to the source layer 381 may be used as a source select line, and one or more layers of gate electrodes 353 adjacent to the first conductive patterns 110 may be used as a drain select line. A plurality of gate electrodes between the gate electrode used as the source select line and the gate electrode used as the drain select line may be used as word lines.

The channel structure 363 may be formed of a semiconductor layer. In an embodiment, the channel structure 363 may be used as a channel region of a NAND flash memory element. A central region of the channel structure 363 may be filled with a core insulating layer 365.

The channel structure 363 may extend toward the source layer 381 and may be connected to the source layer 363. The source layer 381 may include a doped semiconductor layer.

The channel structure 363 may extend toward the first conductive patterns 110 and may be connected to one of the first conductive patterns 110 through a bit line contact 373. The bit line contact 373 may pass through the insulating layer 371 disposed between the first conductive patterns 110 and the gate stack ST.

In an embodiment, the channel structure 363 may overlap two first conductive patterns 110, and the bit line contact 373 may electrically connect the channel structure 363 and one of the two first conductive patterns 110 overlapping the channel structure 363. The other one of the two first conductive patterns 110 overlapping the channel structure 363 may be connected to another channel structure that is not shown in the drawing through another bit line contact that is not shown in the drawing.

In the above-described structure, the first conductive patterns 110 may be used as bit lines of a NAND flash memory element.

The second circuit structure 300B may include a peripheral circuit structure PERI for controlling an operation of the memory cell array structure MCA, and interconnections 321 connected to the peripheral circuit structure PERI.

In an embodiment, the peripheral circuit structure PERI may include a page buffer transistor 310 that controls an operation of a bit line.

The page buffer transistor 310 may be disposed in an active region of a semiconductor substrate 301. The active region of the semiconductor substrate 301 may be partitioned by an element separation layer 303 disposed in the semiconductor substrate 301. The page buffer transistor 310 may include a gate insulating layer 313 and a gate electrode 315 stacked on the active region of the semiconductor substrate 301, and junction regions 311 defined in the active region at both sides of the gate electrode 315. The junction regions 311 may be defined by injecting at least one of an n-type impurity and a p-type impurity into the active region.

The interconnections 321 may be buried in a lower insulating layer 325 covering the page buffer transistor 310 and the semiconductor substrate 301. The interconnections 321 may include conductive patterns of various structures.

The second conductive pattern 210 may pass through the insulating layer 201 on the lower insulating layer 325. The second conductive pattern 210 may be connected to one of the junction regions 311 through some of the interconnections 321. Accordingly, the second conductive pattern 210 may be connected to the page buffer transistor 310.

The first conductive bonding pattern 150 buried in the first insulating structure 190 and the second conductive bonding pattern 250 buried in the second insulating structure 290 may be disposed between the first conductive patterns 110 and the second conductive pattern 210 and may be bonded to each other. The first conductive bonding pattern 150 may be connected to the first conductive patterns 110 by passing through the first etch stop layer 121 of the first insulating structure 190, and the second conductive bonding pattern 250 may be connected to the second conductive pattern 210 by passing through the second etch stop layer 221 of the second insulating structure 290. According to such a structure, one of the first conductive patterns 110 and the second conductive pattern 210 may be connected to each other through the first conductive bonding pattern 150 and the second conductive bonding pattern 250. In addition, the channel structure 363 of the memory cell array structure MCA and the page buffer transistor 310 of the peripheral circuit structure PERI may be connected to each other through the bit line contact 373, one of the first conductive patterns 110, the first conductive bonding pattern 150, the second conductive bonding pattern 250, the second conductive pattern 210, and some of the interconnections 321.

The memory cell array structure MCA and the peripheral circuit structure PERI may be structurally connected to each other by hybrid bonding. The hybrid bonding may be provided by a bonding structure between the first conductive bonding pattern 150 and the second conductive bonding pattern 250 and a bonding structure between the second dielectric layer 141 of the first insulating structure 190 and the fourth dielectric layer 241 of the second insulating structure 290.

Figure 4A:
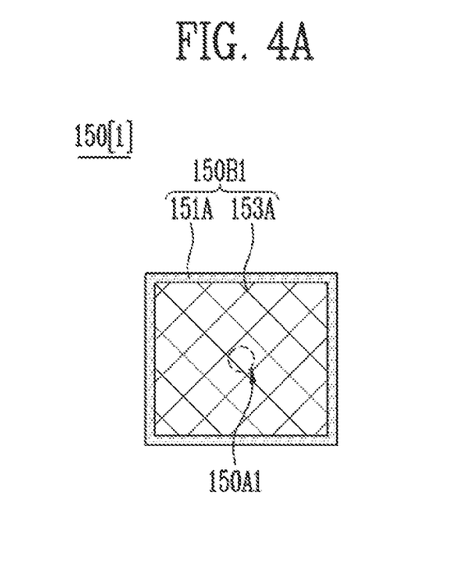
FIGS. 4A and 4B are plan views illustrating conductive bonding patterns according to embodiments of the present disclosure.
Figure 4B:
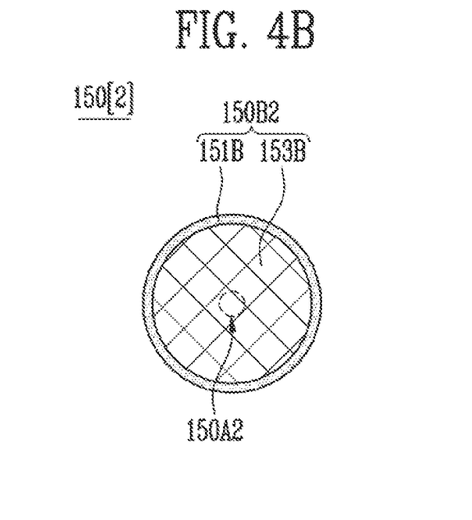

FIGS. 4A and 4B are plan views illustrating conductive bonding patterns according to embodiments of the present disclosure.

Referring to FIGS. 4A and 4B, the conductive bonding pattern 150[1] or 150[2] may include a contact portion 150A1 or 150A2 and a pad portion 150B1 or 150B2. The contact portion 150A1 or 150A2 of the conductive bonding pattern 150[1] or 150[2] may be overlapped by the pad portion 150B1 or 150B2.

A planar structure of the contact portion 150A1 or 150A2 may be a circle. However, the present disclosure is not limited thereto, and the planar structure of the contact portion 150A1 or 150A2 may be various such as an ellipse, a semicircle, and various polygons.

Referring to FIG. 4A, a planar structure of the pad portion 150B1 of the conductive bonding pattern 150[1] may be a square. A metal layer 153A of the pad portion 150B1 may form a square planar structure. A conductive barrier layer 151A of the pad portion 150B1 may extend along an outer wall of the metal layer 153A.

Referring to FIG. 4B, a planar structure of the pad portion 150B2 of the conductive bonding pattern 150[2] may be a circle. A metal layer 153B of the pad portion 150B2 may form a circle planar structure. A conductive barrier layer 151B of the pad portion 150B2 may extend along an outer wall of the metal layer 153B.

A planar structure of the pad portion 150B1 or 150B2 is not limited to the embodiments shown in FIGS. 4A and 4B. Although not shown in the drawing, the planar structure of the pad portion may be various, such as an ellipse, a semicircle, and various polygons.

FIGS. 5A to 5F are cross-sectional views illustrating a method of manufacturing a semiconductor device according to an embodiment of the present disclosure.

Figure 5A:
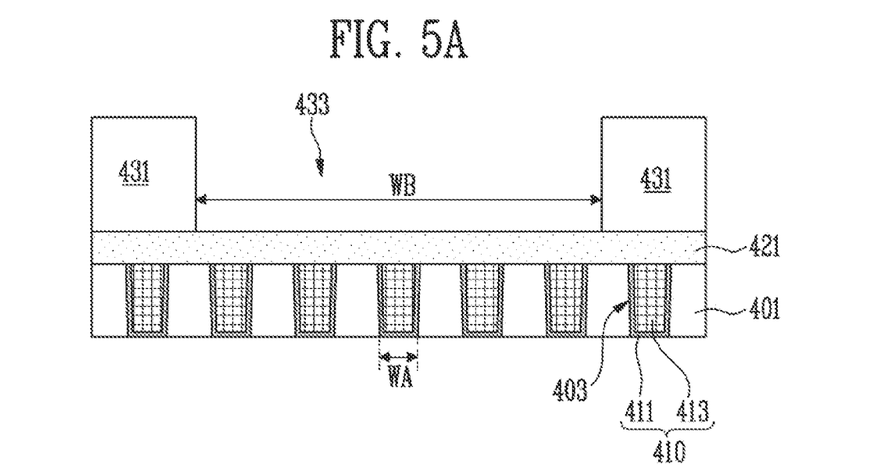
FIGS. 5A, 5B, 5C, 5D, 5E, and 5F are cross-sectional views illustrating a method of manufacturing a semiconductor device according to an embodiment of the present disclosure.

Referring to FIG. 5A, an insulating layer 401 is formed. The insulating layer 401 may be formed on a lower structure. The lower structure may include a circuit structure. In an embodiment, the first circuit structure 300A and the bit line contact 373 shown in FIG. 3 may be provided as a lower structure in a vertically inverted shape.

Subsequently, trenches 403 may be formed. The trenches 403 may pass through the insulating layer 401. The trenches 403 may be formed by etching the insulating layer 401.

Each of the trenches 403 may be filled with conductive patterns 410. Each of the conductive patterns 410 may include a conductive barrier layer 411 and a metal layer 413. The conductive barrier layer 411 may be formed along a surface of each of the trenches 403. The metal layer 413 may fill a central region of each of the trenches 403 on the conductive barrier layer 411.

Thereafter, an etch stop layer 421 may be formed on an exposed surface of each of the conductive patterns 410 and the insulating layer 401. The etch stop layer 421 may include carbon. In an embodiment, the etch stop layer 421 may include silicon carbon nitride (SiCN).

Subsequently, a first dielectric layer 431 may be formed on the etch stop layer 421. The first dielectric layer 431 may be formed of a material different from that of the etch stop layer 421. For example, the first dielectric layer 431 may include a material having an etching selectivity for the etch stop layer 421. In an embodiment, the first dielectric layer 431 may include silicon dioxide ($SiO_2$).

A portion of the first dielectric layer 431 may be etched by an etching process. The portion of the first dielectric layer 431 to be etched may be a portion that is not blocked by a photoresist pattern (not shown) defined through a photolithography process. After removing the portion of the first dielectric layer 431 through the etching process, the photoresist pattern may be removed.

As the portion of the first dielectric layer 431 is removed, an opening 433 passing through the first dielectric layer 431 may be defined. The opening 433 may expose a portion of the etch stop layer 421. A width WB of the opening 433 may be defined to be wider than a width WA of each of the conductive patterns 410. Accordingly, the opening 433 may overlap two or more conductive patterns 410.

The portion of the first dielectric layer 431 to be etched may be removed by an etching process using plasma. A plasma etching apparatus may detect an end point by measuring by-products generated by reacting with an etching gas introduced into a chamber. Because the etch stop layer 421 is formed of a material different from that of the first dielectric layer 431, the etching process of the portion of the first dielectric layer 431 may be ended when the etch stop layer 421 is exposed through the measurement of the by-products.

Because the exposed area of the etch stop layer 421 is proportional to the width WB of the opening 433, as the exposed area of the etch stop layer 421 increases, the end point may be more easily detected through the plasma etching apparatus. According to an embodiment of the present disclosure, because the width WB of the opening 433 as a target is defined to be wider than the width WA of each of the conductive patterns 410, detecting the end point through the plasma etching apparatus becomes easier, compared to a case where the width of the opening is narrowed by the width WA of one of the conductive patterns 410. Accordingly, an embodiment of the present disclosure may reduce a process defect while the opening 433 is formed.

Figure 5B:
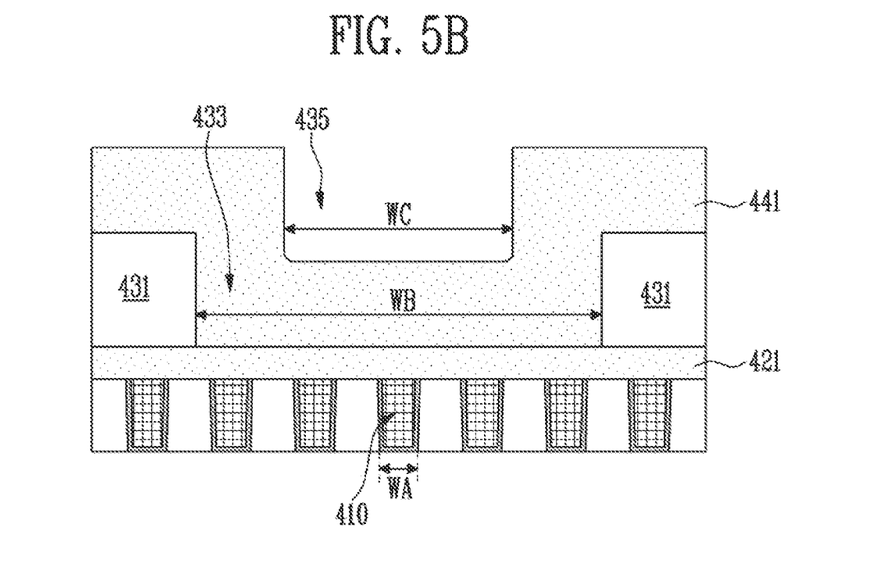

Referring to FIG. 5B, a second dielectric layer 441 may be conformally formed on the etch stop layer 421 and the first dielectric layer 431. The second dielectric layer 441 may extend along a surface of the opening 433 and an upper surface of the first dielectric layer 431. The surface of the opening 433 may be defined by an exposed surface of the etch stop layer 421 and a sidewall of the first dielectric layer 431.

The second dielectric layer 441 may have a groove 435. The groove 435 may overlap the opening 433 and may overlap some of the first conductive patterns 410. A width WC of the groove 435 may be defined to be wider than the width WA of each of the first conductive patterns 410 and narrower than the width WB of the opening 433.

The second dielectric layer 441 may include carbon.

The second dielectric layer 441 may include elements of the same type as the etch stop layer 421. In an embodiment, the second dielectric layer 441 may be formed of the same chemical material as the etch stop layer 421.

In an embodiment, the second dielectric layer 441 may include silicon carbon nitride (SICN).

Figure 5C:
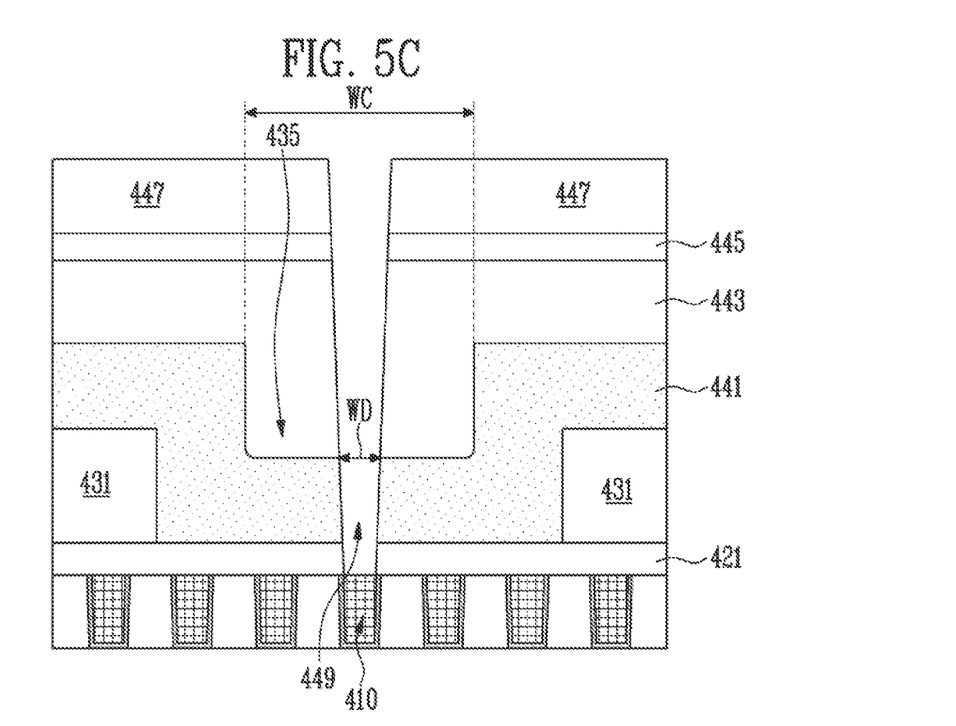

Referring to FIG. 5C, a sacrificial layer 443 may be formed on the second dielectric layer 441. The sacrificial layer 443 may be formed to fill the groove 435. The sacrificial layer 443 may be deposited by spin coating. The sacrificial layer 443 may be a carbon polymer including carbon.

Subsequently, after forming an antireflection layer 445 on the sacrificial layer 443, a photoresist pattern 447 may be formed on the antireflection layer 445. The antireflection layer 445 may include silicon oxynitride (SiON). The photoresist pattern 447 may be defined by a photolithography process.

The sacrificial layer 443, the second dielectric layer 441, and the etch stop layer 421 may be etched through an etching process using the photoresist pattern 447 as an etch barrier. Therefore, a contact hole 449 passing through each of the second dielectric layer 441 and the etch stop layer 421 may be formed. A width WD of the contact hole 449 may be controlled to be narrower than the width WC of the groove 435 so that one of the conductive patterns 410 may be exposed by the contact hole 449.

The contact hole 449 may be defined by removing portions of each of the second dielectric layer 441 and the etch stop layer 421, which are not overlapped the first dielectric layer 431 and overlapped the groove 435, through an etching process. The sacrificial layer 443, the second dielectric layer 441, and the etch stop layer 421 may be formed of carbon-based material layers. According to the embodiment of the present disclosure, compared to a case where a contact hole is formed by etching a carbon-based material layer and a material layer that does not include carbon, the etching process may be simplified. In addition, a width variation of the contact hole 449 may be reduced, and a critical dimension of the contact hole 449 may be easily secured. As a result, according to an embodiment of the present disclosure, the contact hole 449 may be stably aligned with one of the conductive patterns 410.

Figure 5D:
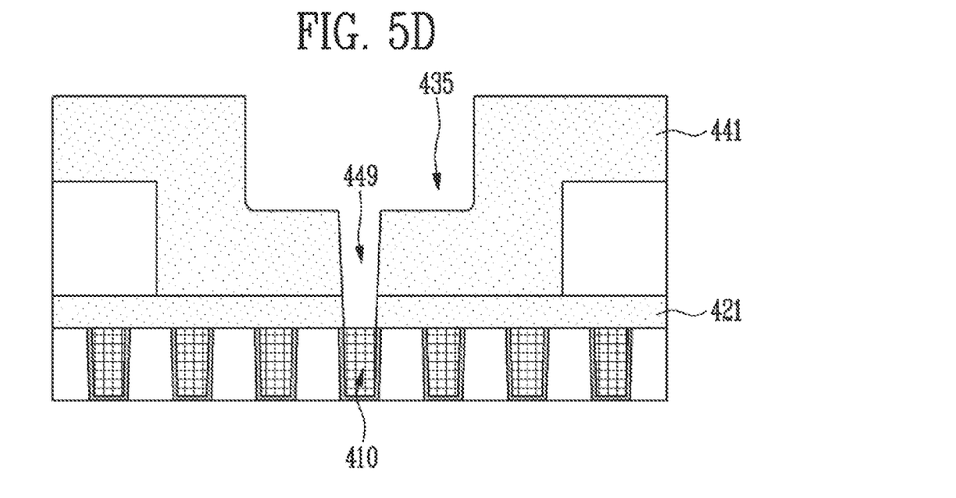

Referring to FIG. 5D, the photoresist pattern 447, the antireflection layer 445, and the sacrificial layer 443 shown in FIG. 5C may be removed so that the groove 435 is opened and the second dielectric layer 441 is exposed.

Figure 5E:
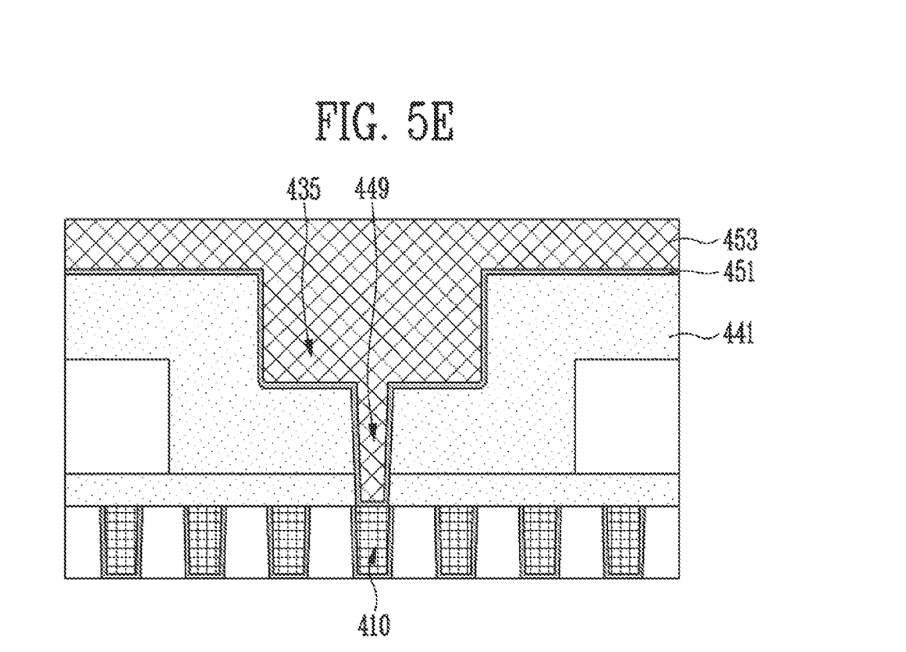

Referring to FIG. 5E, exposed surfaces may be defined on the first conductive pattern 410 and the second dielectric layer 441 through the contact hole 449 and the opening 435. The conductive barrier layer 451 may be formed on the exposed surface of the first conductive pattern 410 and the exposed surface of the second dielectric layer 441. Subsequently, a metal layer 453 may be formed on the conductive barrier layer 451.

Figure 5F:
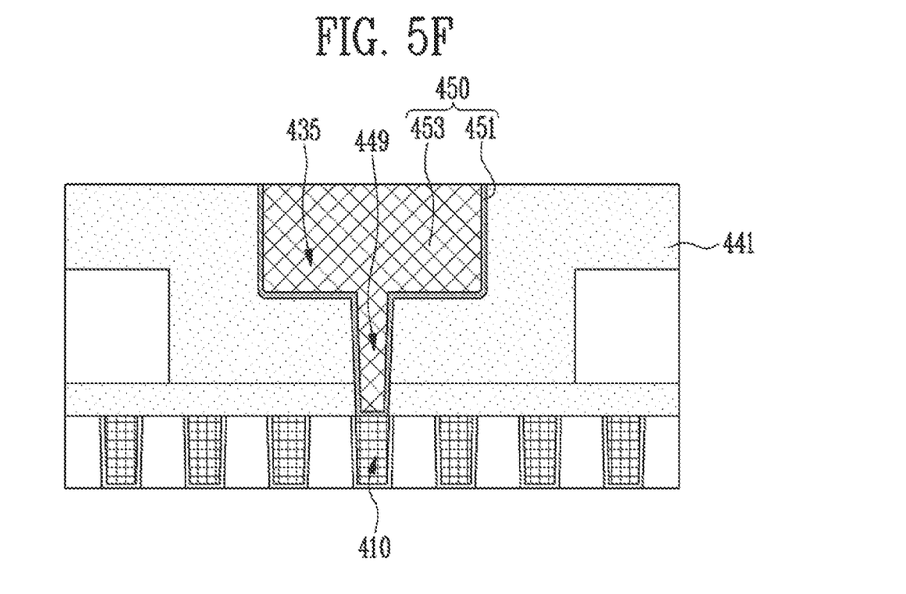

Referring to FIG. 5F, an upper surface of the second dielectric layer 441 may be exposed by removing portions of each of the conductive barrier layer 451 and the metal layer 453. Accordingly, a conductive bonding pattern 450 that fills the contact hole 449 and the opening 435 and is connected to the conductive pattern 410 may be defined. In removing a portion of the conductive barrier layer 451 and the metal layer 453, a planarization process such as chemical mechanical polishing (CMP) may be used.

Figure 6:
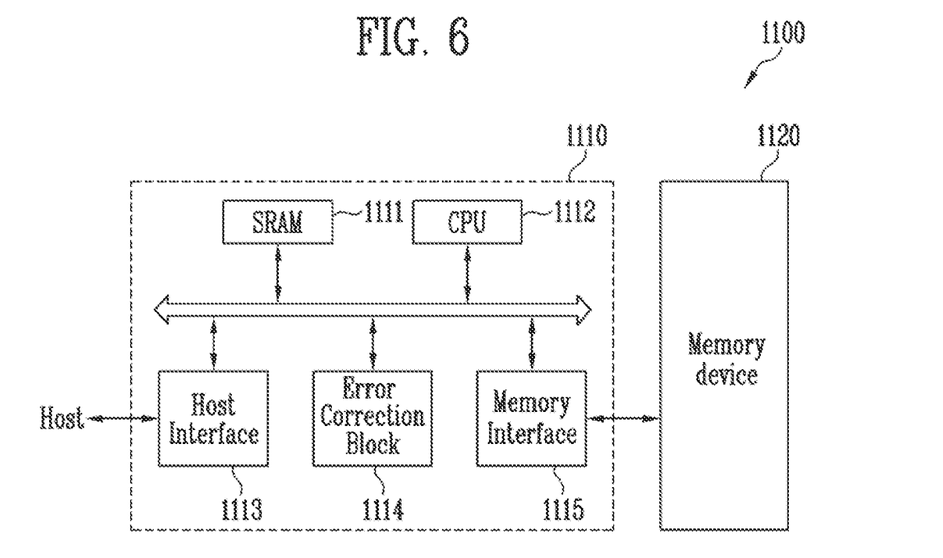
FIG. 6 is a block diagram illustrating a configuration of a memory system according to an embodiment of the present disclosure.

FIG. 6 is a block diagram illustrating a configuration of a memory system according to an embodiment of the present disclosure.

Referring to FIG. 6, the memory system 1100 includes a memory device 1120 and a memory controller 1110.

The memory device 1120 may be a multi-chip package configured of a plurality of flash memory chips. The memory device 1120 may include a memory cell array structure and a peripheral circuit structure connected to each other. One of the memory cell array structure and the peripheral circuit structure may be connected to the other through a conductive bonding pattern buried in an insulating structure. The conductive bonding pattern may include a contact portion and a pad portion extending from the contact portion and having a width wider than that of the contact portion. The insulating structure may include an etch stop layer, a first dielectric layer on the etch stop layer, and a second dielectric layer between the conductive bonding pattern and the first dielectric layer. The etch stop layer may be penetrated by the contact portion of the conductive bonding pattern. The first dielectric layer may be spaced apart from the conductive bonding pattern. The second dielectric layer may extend to contact an upper surface of the first dielectric layer.

The memory controller 1110 may be configured to control the memory device 1120, and may include static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs an overall control operation for data exchange of the memory controller 1110, and the host interface 1113 include a data exchange protocol of a host connected to the memory system 1100. The error correction block 1114 detects an error included in data read from the memory device 1120 and corrects the detected error. The memory interface 1115 performs interfacing with the memory device 1120. The memory controller 1110 may further include read only memory (ROM) that stores code data for interfacing with the host.

The above-described memory system 1100 may be a memory card or a solid state drive (SSD) in which the memory device 1120 and the memory controller 1110 are combined. For example, when the memory system 1100 is the SSD, the memory controller 1110 may communicate with the outside (for example, the host) through one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

Figure 7:
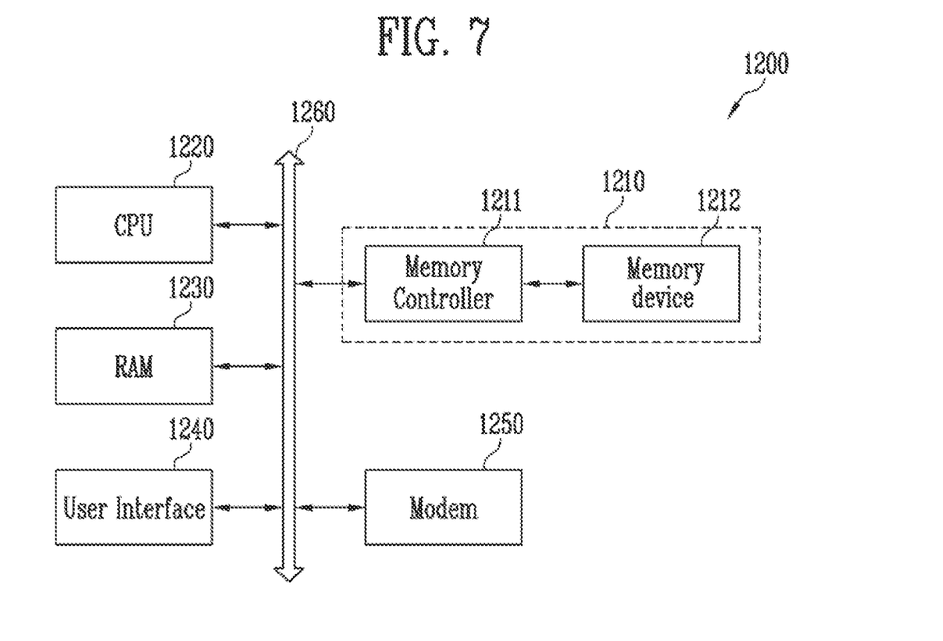
FIG. 7 is a block diagram illustrating a configuration of a computing system according to an embodiment of the present disclosure.

FIG. 7 is a block diagram illustrating a configuration of a computing system according to an embodiment of the present disclosure.

Referring to FIG. 7, the computing system 1200 may include a CPU 1220, random access memory (RAM) 1230, a user interface 1240, a modem 1250, and a memory system 1210 electrically connected to a system bus 1260. When the computing system 1200 is a mobile device, a battery for supplying an operation voltage to the computing system 1200 may be further included, and an application chipset, an image processor, a mobile DRAM, and the like may be further included.

The memory system 1210 may include a memory device 1212 and a memory controller 1211.

The memory device 1212 may be the same as the memory device 1120 described with reference to FIG. 6. The memory controller 1211 may be the same as the memory controller 1100 described with reference to FIG. 6.

According to the present disclose, because the conductive bonding pattern may be stably aligned with the conductive pattern, a process defect may be decreased and reliability of the semiconductor device may be improved.

What is claimed is:

1. A semiconductor device comprising:
   a first conductive bonding pattern and a second conductive bonding pattern bonded to each other and extending toward opposite directions;
   a first etch stop layer penetrated by an end of the first conductive bonding pattern;
   a second etch stop layer penetrated by an end of the second conductive bonding pattern;
   a first dielectric layer disposed between the first etch stop layer and the second etch stop layer and having a first sidewall facing the first conductive bonding pattern;
   a second dielectric layer disposed between the first conductive bonding pattern and the first sidewall of the first dielectric layer and extending between the first dielectric layer and the second etch stop layer;
   a third dielectric layer disposed between the second dielectric layer and the second etch stop layer and having a second sidewall facing the second conductive bonding pattern; and
   a fourth dielectric layer disposed between the second conductive bonding pattern and the second sidewall of the third dielectric layer, extending between the third dielectric layer and the second dielectric layer, and bonded to the second dielectric layer,
   wherein the second dielectric layer has a first surface, the first surface contacting the first etch stop layer and being wider than the end of the first conductive bonding pattern, and
   wherein the fourth dielectric layer has a second surface, the second surface contacting the second etch stop layer and being wider than the end of the second conductive bonding pattern.

2. The semiconductor device of claim 1, wherein each of the first conductive bonding pattern and the second conductive bonding pattern comprises:
   a pad portion adjacent to a bonding surface between the first conductive bonding pattern and the second conductive bonding pattern; and
   a contact portion extending in a direction away from the bonding surface from the pad portion,
   wherein a width of the pad portion is wider than a width of the contact portion.

3. The semiconductor device of claim 2,
   wherein the second dielectric layer extends to be in contact with a sidewall of the contact portion of the first conductive bonding pattern, one surface of the pad portion of the first conductive bonding pattern facing the first etch stop layer, a sidewall of the pad portion of the first conductive bonding pattern, the first sidewall of the first dielectric layer, and one surface of the first dielectric layer facing the fourth dielectric layer.

4. The semiconductor device of claim 2,
   wherein the fourth dielectric layer extends to be in contact with a sidewall of the contact portion of the second conductive bonding pattern, a surface of the pad portion of the second conductive bonding pattern facing the second etch stop layer, a sidewall of the pad portion of the second conductive bonding pattern, the second sidewall of the third dielectric layer, and a surface of the third dielectric layer facing the second dielectric layer.

5. The semiconductor device of claim 1, further comprising:
   a first conductive pattern connected to the end of the first conductive bonding pattern;
   a second conductive pattern connected to the end of the second conductive bonding pattern;
   a first circuit structure connected to the first conductive pattern; and
   a second circuit structure connected to the second conductive pattern,
   wherein the first conductive pattern, the first conductive bonding pattern, the second conductive bonding pattern, and the second conductive pattern are disposed between the first circuit structure and the second circuit structure.

6. The semiconductor device of claim 5,
   wherein the first circuit structure includes a memory cell array structure, and the second circuit structure includes a peripheral circuit structure.

7. The semiconductor device of claim 6,
   wherein the first conductive pattern is a bit line connected to a channel structure of the memory cell array structure, and
   the second conductive pattern is connected to a page buffer transistor of the peripheral circuit structure.

8. The semiconductor device of claim 1,
   wherein the second dielectric layer is formed of the same material as the first etch stop layer, and
   the fourth dielectric layer is formed of the same material as the second etch stop layer.

9. The semiconductor device of claim 1,
   wherein the first etch stop layer and the second dielectric layer are formed of a material different from a material of the first dielectric layer, and
   the second etch stop layer and the fourth dielectric layer are formed of a material different from a material of the third dielectric layer.

10. The semiconductor device of claim 1,
    wherein the first etch stop layer, the second etch stop layer, the second dielectric layer, and the fourth dielectric layer include silicon carbon nitride (SiCN).

11. The semiconductor device of claim 1,
    wherein the first dielectric layer and the third dielectric layer include silicon dioxide ($SiO_2$).

* * * * *